United States Patent [19]

Lammers

[11] Patent Number: 5,404,095
[45] Date of Patent: Apr. 4, 1995

[54] MODE POWER SUPPLY INCLUDING SELF-INDUCTANCE IN THE DRIVE CIRCUIT

[75] Inventor: Franciscus H. Th. Lammers, Eindhoven, Netherlands

[73] Assignee: U.S. Philips Corporation, New York, N.Y.

[21] Appl. No.: 232,853

[22] Filed: Apr. 25, 1994

Related U.S. Application Data

[63] Continuation of Ser. No. 862,087, Apr. 2, 1992, abandoned.

[30] Foreign Application Priority Data

Apr. 4, 1991 [EP] European Pat. Off. ............ 91200782

[51] Int. Cl.⁶ ...................... H02M 3/335; G05F 1/56
[52] U.S. Cl. ..................................... 323/290; 323/222; 323/259; 363/124; 315/209 R; 315/DIG. 7
[58] Field of Search ................. 363/124; 323/222, 247, 323/282, 290, 301, 328, 355, 259; 315/209 R, DIG. 7

[56] References Cited

U.S. PATENT DOCUMENTS 4,034,282 7/1977 Renard .
4,449,174 5/1984 Ziesse .
4,866,367 9/1989 Ridley .

Primary Examiner—Steven L. Stephan
Assistant Examiner—Y. Jessica Han
Attorney, Agent, or Firm—Laurie E. Gathman

[57] ABSTRACT

A circuit arrangement provided with a switch mode power supply energized with a pulsatory input current generated by means of high-frequency switching of the main switching means HS (3) provided in turn with a drive circuit (6) having at least drive switching means SS (60) and connected to a return current line (7).

A self-inductance element (61) is included in the drive circuit, preferably between the main switching means HS and the drive switching means SS. This arrangement results in a rapid level shifter of compact construction.

11 Claims, 1 Drawing Sheet

MODE POWER SUPPLY INCLUDING SELF-INDUCTANCE IN THE DRIVE CIRCUIT

This is a continuation of application Ser. No. 07/862,087, filed Apr. 2, 1992, now abandoned.

BACKGROUND OF THE INVENTION

The present invention relates to a circuit arrangement provided with a switch mode power supply energized with pulsatory input current an output generated by high-frequency switching of main switch. The main switch is provided with a drive circuit comprising at least a drive switch connected to a return current line.

A circuit arrangement, where the switch mode power supply is constructed as a down-converter and connected to a public supply mains via a rectifier circuit is disclosed in U.S. Pat. No. 4,132,925. The switch mode power supply unit supplies a discharge lamp which acts as the electric load. It has become increasingly customary to supply switch mode power supplies through a preconditioner, for example, in order to meet requirements imposed on the current drawn from the supply mains (mains current requirements). The mains voltage is transformed to a DC voltage of 380 to 400 V in such a preconditioner. The preconditioner preferably forms part of the circuit arrangement which comprises the switch mode power supply.

Switch mode power supplies constructed in this way find their application as circuit arrangements for operating many kinds of electric loads, among them discharge lamps, but also, for example, small domestic appliances. The switch mode power supply may also be a commutator network, for example, a bridge circuit.

Bipolar transistors are used for the main switch and the drive switch in the known circuit arrangement. The use of bipolar transistors in applications in which a preconditioner as described above is used, however, has certain drawbacks, for example, the switching losses occurring at supply voltages of 380 V and higher become unacceptably high. Under such conditions the use of (MOS)FETs is more advantageous and practical. An important difference between a bipolar transistor and a (MOS)FET when used as a switching element is that a continuous base current is required to keep a bipolar transistor switched to the conducting state, whereas a voltage between gate and source of the order of 10 V must be maintained in the case of a (MOS)FET.

Switching the main switch into the conducting and non-conducting state in a switch mode power supply which acts as a supply source for an electric load is preferably done with a repetition frequency of 18 kHz or more, since there is a risk of acoustic interference at a lower repetition frequency. The use of a repetition frequency with such a high value requires that the switching process of the switch takes place very quickly, in a time interval of at most 1 µs, but preferably much quicker. In the known circuit arrangement, however, this also contributes to comparatively high switching losses. This can be explained as follows.

In the known circuit arrangement, a high and a low voltage is alternately applied to the emitter of the bipolar transistor which acts as the drive switch. The drive circuit acting as level shifter contains a resistor as the current limiter. If switching of the switching means is to take place comparatively quickly, however, the resistance should be small, so that the switching process involves comparatively strong currents and accordingly comparatively great losses.

When (MOS)FET elements are used as the switching means, this has been counteracted in practice through the use of a pulse transformer in the drive circuit. This achieves a permanent electrical isolation between comparatively high voltage levels at the gate of the (MOS)FET acting as the main switch and a comparatively low drive voltage level. The use of a transformer, however, is disadvantageous since it cannot or cannot easily be integrated, is generally bulky and heavy, and moreover requires a separate drive if it is to operate satisfactorily.

SUMMARY OF THE INVENTION

Accordingly, it is desired to provide an improved circuit arrangement wherein the drive circuit includes a self-inducting device thus permitting the use of MOS(-FET's) in the circuit without the use of a transformer.

Generally speaking, in accordance with the present invention, a circuit arrangement is provided with a switch mode power supply energized with pulsatory input and an output which is generated by high frequency switching of the main switch. The main switch is provided with a drive circuit comprising at least a drive switch connected to a return current line. The drive circuit including self-inductance which enables the use of a (MOS)FET element acting as the main switch in the circuit arrangement. Through the use of the self-inducting device, which acts as a temporary power storage, it was surprisingly found to be possible to equip the switch mode power supply with (MOS)-FET elements and at the same time to keep the portion acting as the level shifter free from electrical isolations.

Preferably, the self-inducting device is included in the form of a micro-choke between a main switch and a drive switch. The measure according to the invention is particularly suitable for use with a down-converter and a commutator network such as, for example, a half bridge circuit.

A possible modification of the drive circuit is that SS and the inductive device form part of an up-converter circuit of which an output is connected to the main switch through a diode. Supply of the up-converter circuit takes place from a low-voltage auxiliary source. To obtain a drive voltage at the main switch which is sufficiently above the preconditioner voltage, it will be necessary in this modification either to draw a comparatively high current from the auxiliary source, or to cause the self-inducting device to have a comparatively high value.

It is true that the use of self-inducting means leads to a certain delay of the switching moment of the main switch relative to the switching moment of the drive switch, compared with the known circuit arrangement. This, however, is no more than a delay which is to be regarded as a phase shift and which does not detract from the envisaged advantage that the switching of the main switch takes place very quickly.

A further advantage in the circuit arrangement according to the invention, with a (MOS)FET as the the main switch can be achieved with a capacitive device connected periodically between gate and source of the (MOS)FET which acts as a voltage source. The capacitive device may be charged to a desired voltage via an auxiliary supply point during the period in which the (MOS)FET acting as the main switch is switched to the non-conducting state. The capacitive device thus charged supplies the required voltage differential between gate and source during the periods in which the (MOS)FET is switched to the conducting state. Through a suitable choice of the value of the capacitive means the latter can serve as a voltage source for the gate voltage. The required voltage between gate and source of the (MOS)FET is thus provided in an advantageous way, while an auxiliary supply point itself need not form part of the portion which acts as the level shifter.

Accordingly, it is an object of the present invention to provide a circuit arrangement including a switch mode power supply energized with pulsatory input current and an output generated by high frequency switching of the main switch which is driven by a drive circuit including self inductance without mutual inductance such as a transformer.

Another object of the present invention is to provide a switch mode power supply with (MOS) FET elements.

A further object of the present invention is to provide a switch mode power supply which reduces switching losses.

Still other objects and advantages of the invention will in part be apparent from the specification.

The invention accordingly comprises the features of construction, combination of elements, and arrangement of parts which will be exemplified in the constructions hereinafter set forth and the scope of the invention will be indicated in the claims.

BRIEF DESCRIPTION OF THE DRAWINGS

For a fuller understanding of the invention, reference is had to the following description taken in connection with the accompanying drawings, in which.

DESCRIPTION OF THE PREFERRED EMBODIMENTS

Figure 1:
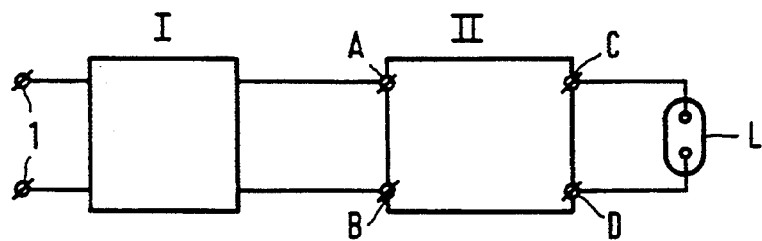
FIG. 1 is a diagram of the circuit arrangement provided with a switch mode power supply for operating a load.
Figure 2:
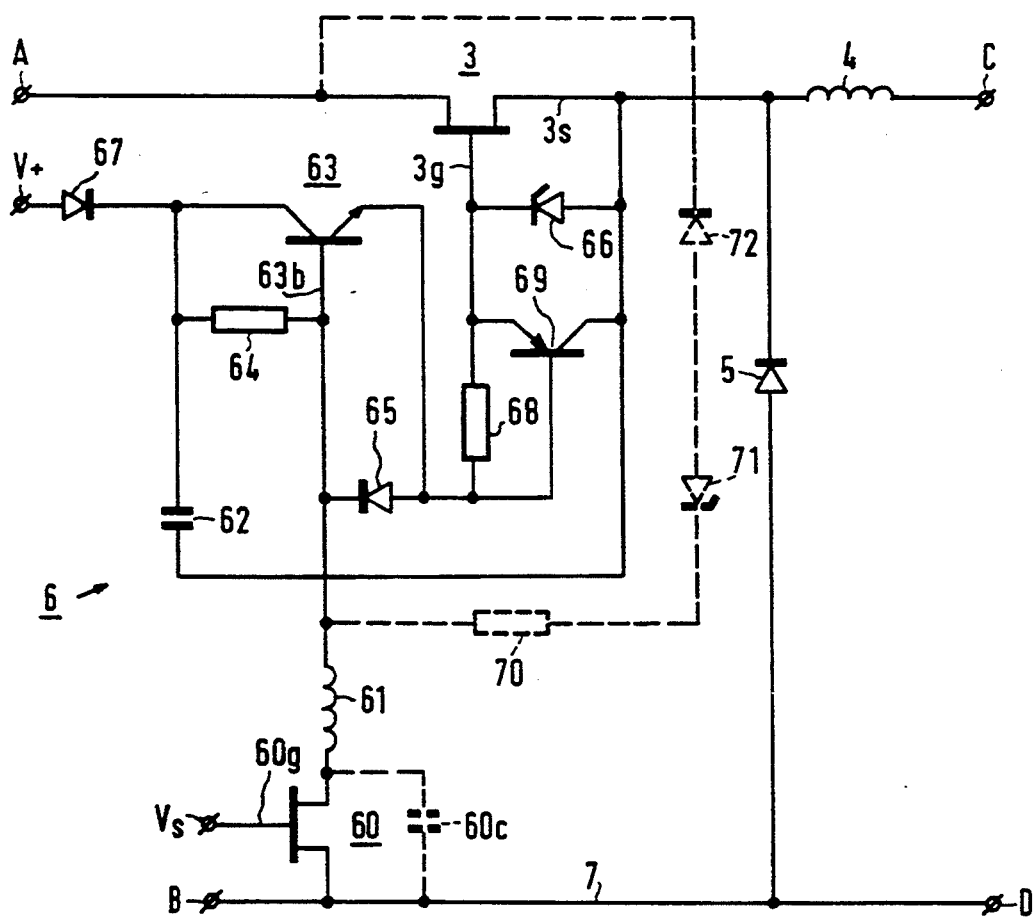
FIG. 2 is a detailed view of the switch mode power supply of FIG. 1.

A circuit arrangement according to the invention shown in FIG. 1 has connection terminals 1 for connection to a supply source, for example, a public supply mains of 220 V, 50 Hz. The circuit arrangement is provided with a preconditioner I and with a switch mode power supply II. The switch mode power supply II supplies an electric load L. The switch mode power supply II is constructed as a down-converter which is shown in detail in FIG. 2 and which has a pulsatory input current generated by means of high-frequency switching of the main switch HS constructed as a (MOS)FET 3. The main switch 3 is provided with a drive circuit 6 comprising drive switch in the form of (MOS)FET 60 and connected to a return current line 7.

The down-converter further comprises a self-inductance 4 and a diode 5. The drive circuit of the main switch comprises a switching transistor 63 and self-inducting device 61 which is connected between the main switch and the drive switch. The drive circuit also comprises a capacitive device in the form of capacitor 62 as a voltage source which is to be periodically connected between gate $3g$ and source $3s$ of (MOS)FET 3. Capacitor 62 is connected on the one hand to an auxiliary supply point $V_+$ via a diode 67, and on the other hand to source $3s$ of MOSFET 3. Switching transistor 63 is connected on the one hand to auxiliary supply point $V_+$ via diode 67, and on the other hand to gate $3g$, and has a base $63b$ which is connected to auxiliary supply point $V_+$ through resistor 64 and diode 67 as well as to self-inducting device 61.

A pulsatory voltage $V_S$ consisting of high-frequency voltage pulses of 10 V is connected to a gate $60g$ of the drive switch 60. The drive switch is made conducting and non-conducting periodically with high frequency by pulsatory voltage $V_S$. The pulsatory voltage $V_S$ is derived from a functional generator which forms part of a control circuit for controlling the operation of the electric load and which is not indicated in any detail.

The parasitic capacitance inherent in drive switch 60 is indicated as $60c$.

The operation of drive circuit 6 of the down-converter can be understood as follows. Assuming the circuit to be operational, current will flow in the branch 61, 60 if a voltage pulse $V_S$ is present at gate $60g$ of MOSFET 60. The parasitic capacitance $60c$ is short-circuited. Base $63b$ of switching transistor 63 has a low voltage, so that 63 is non-conducting and gate $3g$ of MOSFET 3 carries a voltage which is substantially equal to approximately 0.7 V lower than the voltage of source $3s$. As a result, the MOSFET 3 is non-conducting. Auxiliary supply point $V_+$ takes care of both the further charging of capacitor 62 and the supply of current through the branch 64, 61, 60.

When the voltage pulse at gate $60g$ is ended, MOSFET 60 enters the non-conducting state. The current through micro-choke 61 will now see to the charging of the parasitic capacitance $60c$. Simultaneously the voltage at base $63b$ rises, so that switching transistor 63 becomes conducting and the voltage across capacitor 62 is connected between gate $3g$ and source $3s$ of MOSFET 3, so that capacitor 62 serves as a voltage source for switching MOSFET 3 into the conducting state.

It is in particular the absolute necessity of periodic charging of the parasitic capacitance $60c$ of MOSFET 60 whenever MOSFET 60 becomes non-conducting which influences the switching speed of MOSFET 3.

In the known circuit arrangement, such charging takes place through a resistor chain which must carry a comparatively strong current to ensure sufficiently quick charging, and which therefore gives rise to comparatively high losses. The measure according to the invention utilizes power storage in the inductive device 61, by which it is achieved that both a quick charging of the parasitic capacitance $60c$ takes place and losses in the drive circuit remain very limited.

During a next voltage pulse $V_S$, MOSFET 60 will become conducting. The charge at gate $3g$ of (MOS)FET 3 will be drained through micro-choke 61. The use of a transistor 69 was found to be favourable for achieving both a well-defined moment of disconnecting MOSFET 3 and a defined limitation of the current through micro-choke 61. The value of resistor 68 then determines the moment transistor 69 becomes conducting, and thus determines the value of the current through micro-choke 61.

It was found to be favourable to include a voltage limiting device between on the one hand a common junction point of micro-choke 61 and parasitic capacitance $60c$ and on the other hand point A as a protection against an undesirable high voltage across MOSFET 60 and also to prevent undamped oscillation of the combination of micro-choke 61 and parasitic capacitance $60c$. In an embodiment, this voltage limiting device includes a voltage limiting network of a resistor 70, a zener diode 71, and a diode 72.

In a practical embodiment of the example described, the circuit arrangement is constructed as an arrangement for operating a discharge lamp as the electric load.

The circuit arrangement in that case is connected to a 220 V, 50 Hz supply source. This supply voltage is transformed in the preconditioner I, constructed as an up-converter, to a DC voltage of 380 V which appears at point A of the switch mode power supply constructed as a down-converter. The down-converter acting as a current source operates the load L which has the form of a discharge lamp and which is included in a commutator which is not shown in any detail. The discharge lamp is a high-pressure metal halide lamp with a power rating of 70 W and a lamp voltage of 85 V. The commutator which commutes the current through the lamp at a low frequency serves to prevent the occurrence of cataphoresis in the lamp.

Main switch 3 of the down-converter is a BUK 454 type MOSFET and drive switch 60 is an SGS P239 type MOSFET. Auxiliary supply point $V_+$ is a 10 VDC voltage source. Pulsatory voltage $V_S$ comprises voltage pulses of 10 V generated by a monostable multivibrator which is driven in dependence on the actual lamp current and lamp voltage. Switching transistor 63 is of the bipolar BC 847c type. The inductive device 61 is constructed as a micro-choke, make TDK, with a value of 3 mH. Capacitor 62 has a value of 100 nF and resistor 64 of 1 kΩ. Diode 65 is of the BAT 85 type and zener diode 66 of the BZX79C18 type with a zener voltage 18 V. Transistor 69 is of the BC807c type and resistor 68 has a value of 27 Ohms. In the voltage limiting network, resistor 70 has a value of 1 kOhm, zener diode 71 is of the BZX79C24 type with a zener voltage of 24 V, and diode 72 is of the RGP10J type.

The down-converter is operated with a repetition frequency between 18 kHz and 100 kHz, depending on the operating condition of the lamp. The repetition frequency is approximately 45 kHz in a stable operating condition of the lamp. MOSFET 3 is in its conducting state for approximately 30% of the cycle duration each switching cycle.

Switching the MOSFET 3 to the non-conducting state requires approximately 40 ns, and to the conducting state approximately 50 ns.

The micro-choke 61 forms together with the parasitic capacitance 60c of MOSFET 60 an oscillation circuit with a frequency of 550 kHz.

The maximum current through micro-choke 61 is 40 mA, and the current through switching transistor 63 in the conducting state is 100 mA.

A delay of 270 ns between the switching moments of MOSFET 60 and MOSFET 3 was measured, both in the case of switching to the conducting and to the non-conducting state.

I claim:

1. A switch mode power supply having
a main switching means operating at a high frequency for providing an output voltage;
a main voltage input switched by said main switching means; and
a drive circuit comprising drive switching means for controlling the switching of said main switching means, said main switching means being responsive to an auxiliary supply voltage applied to said drive circuit;
wherein the improvement comprises:
said drive circuit including self-inducting means without mutual inductance and wherein said voltage levels of the main voltage and the output voltage are substantially level shifted from the auxiliary supply voltage such that the main voltage varies from about 0V to about 400V and said auxiliary supply voltage is equal to or below about 30 volts.

2. The switch mode power supply according to claim 1, wherein the self-inducting means is connected between said main switching means and said drive switching means through a transistor and a resistor.

3. The switch mode power supply according to claim 2, wherein said main switching means is a MOSFET having a gate and a source, and a capacitor is provided as a voltage source and periodically connected between the gate and the source of said MOSFET for switching said MOSFET.

4. The switch mode power supply according to claim 1, wherein the switch mode power supply is constructed as a down converter.

5. The switch mode power supply according to claim 1, including further inducting means wherein the drive switching means and said further inductive means form part of an up-converter circuit having an output connected to said main switching means through a diode.

6. The switch mode power supply according to claim 1, wherein said main switching means is a MOSFET having a gate and a source, and a capacitor is provided as a voltage source and periodically connected between the gate and the source of said MOSFET for switching said MOSFET.

7. The switch mode power supply according to claim 6, wherein said switch mode power supply supplies a discharge lamp.

8. A switch mode power supply, comprising:
main switching means having a main current path and a control electrode;
an output terminal coupled to said main current path of said main switching means;
an input terminal, for receiving a main voltage input, coupled to said main current path of said main switching means, said main switching means being switchable at a high frequency to switchably connect said main voltage input to said output terminal, thereby providing an output voltage to said output terminal; and
a drive circuit for controlling the switching frequency of said main switching means, said drive circuit including (i) drive switching means, having a main current path and a control electrode, for controlling switching of said main switching means and for receiving a first auxiliary input, (ii) a switching transistor, having a main current path and a control electrode, for controlling switching of said main switching means and for receiving a second auxiliary input, said main current path of said switching transistor being coupled between said second auxiliary input and said control electrode of said main switching means, (iii) self-inducting means for controlling switching of said switching transistor, said self inducting means being without mutual inductance, and having a first end coupled to said main current path of said drive switching means and a second end coupled to said control electrode of said switching transistor, and (iv) voltage source means switchably coupled to said main switching means by said switching transistor for periodically causing said main switching means to become conductive.

9. A switch mode power supply as claimed in claim 8, wherein said voltage source means includes a capacitor having a first end coupled to said second auxiliary input and to said main current path of said switching transistor and a second end coupled to said output terminal.

10. A switch mode power supply as claimed in claim 8, further including an inductor coupled between said output terminal and said main current path of said main switching means.

11. A switch mode power supply, comprising:
a main mosfet operating at a high switching frequency for providing an output voltage and including a main current path and a control gate;
an output terminal;
an input terminal for receiving a main voltage input, which main voltage input is switched to said output terminal by said main mosfet; and
a drive circuit for controlling the switching frequency of said main mosfet, said drive circuit including (i) a driving mosfet alternately conducting current in response to a pulsating auxiliary input and having a parasitic capacitance for controlling switching of said main mosfet, (ii) a capacitor for serving as a voltage source for said main mosfet, (iii) a switch having a control electrode for switchably coupling said capacitor to said control gate of said main mosfet, (iv) self inducting means, for charging said parasitic capacitance upon said driving mosfet becoming non-conducting, said self inducting means being without mutual inductance and having a first end coupled to said driving mosfet and a second end coupled to said control electrode of said switch, said charged parasitic capacitance causing said switch to couple said capacitor to said control gate of said main mosfet thereby causing said main mosfet to become conducting, and in response to said driving mosfet becoming conducting, said capacitor discharging through said self inducting means thereby causing said main mosfet to become non-conducting.

* * * * *